(12) United States Patent
Fukuda et al.

(10) Patent No.: US 6,306,456 B1
(45) Date of Patent: Oct. 23, 2001

(54) ELECTRODE OF ELECTRONIC COMPONENT PART AND CONDUCTIVE PASTE COATING DEVICE

(75) Inventors: Makoto Fukuda, Takefu; Tadahiro Nakagawa, Fukui, both of (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/257,529

(22) Filed: Feb. 25, 1999

(30) Foreign Application Priority Data

Mar. 13, 1998 (JP) .................................................. 10-063388

(51) Int. Cl.⁷ ...................................................... B05D 5/12
(52) U.S. Cl. .............................. 427/58; 427/11; 427/272; 427/282; 427/369; 427/123
(58) Field of Search .................................. 427/96, 79, 102, 427/369, 272, 146, 11, 58, 126.1, 282, 123; 118/406, 407, 76

(56) References Cited

U.S. PATENT DOCUMENTS

| 2,543,045 | * | 2/1951 | Murray ................................... | 118/565 |
| 5,185,040 | * | 2/1993 | Sakai et al. ........................... | 118/406 |
| 5,650,199 | * | 7/1997 | Chnag et al. .......................... | 427/97 |

\* cited by examiner

*Primary Examiner*—Brian K. Talbot
(74) *Attorney, Agent, or Firm*—Burns, Doane, Swecker & Mathis, LLP

(57) ABSTRACT

A method of forming an electrode of electronic component part which comprises: filling conductive paste in a slit of a slit plate, the slit being nearly equal to the width of an electrode to be formed and having an opening in the upper surface of the slit plate, making a rubber plate in contact with the side of the lower surface of the slit plate, making an electronic part in contact with and pressing against the upper surface of the slit plate, making the rubber plate deform so that the upper surface of the rubber plate protrudes into the slit, and by the deformation making the conductive paste protrude over the slit and adhere to the lower surface of the electronic part.

4 Claims, 4 Drawing Sheets

ELECTRODE OF ELECTRONIC COMPONENT PART AND CONDUCTIVE PASTE COATING DEVICE

This application claims priority under 35 U.S.C.§§119 and/or 365 to 10-063388 filed in Japan on Mar. 13, 1998; the entire content of which is hereby incorporated by reference.

BACKGROUND OF THE INVENTION

1. Field of the Invention

The present invention relates to a method for coating conductive paste and forming an electrode on an external surface of an electronic component part and a conductive paste coating device to be used in such method.

2. Description of the Related Art

Up to now, methods for forming an external electrode by coating and baking conductive paste on an external surface of an electronic component part have been widely used. Examples of such conventional methods for coating such coating paste efficiently are shown in FIGS. 6 and 7.

In the conductive paste coating method shown in FIG. 6, a device constructed by combination of a slit plate 51 and a container 52 for coating conductive paste is used. In the slit plate 51, a slit 53 cut from the upper surface 51a through the lower surface 51b is formed. The width of the opening on the side of the upper surface 5la of the slit 53 is made nearly equal to the width of an electrode to be formed on an electronic part 54.

Conductive paste 55 fills the inside of the container 52, which is for storing coating conductive paste. Also, inside the container 52 for coating conductive paste, a piston 56 is arranged. The piston 56 is connected to a driving source (not illustrated) and is movable upward and downward.

When conductive paste 55 is coated on an external surface of the electronic part 54, the electronic part 54 is placed and held on the upper surface 5la of the slit plate 51 and the conductive paste 55 is coated on the external surface of the electronic part 54 by pushing the piston 56 up and pushing the conductive paste 55 up through the slit 53.

The method shown in FIG. 7 uses a rubber plate 58 on the upper surface of which a slit 57 is formed. The width of the slit 57 is made nearly equal to the width of an electrode to be formed on an external surface of an electronic part 54. Also, the slit 57 is filled with the conductive paste 55. Here, by the electronic part 54 being pressed upon the upper surface 58a of the rubber plate 58 in the direction of an arrow in FIG. 7, and the rubber plate 58 being elastically deformed, the conductive paste 55 in the slit 57 is made to adhere to the external surface of the electronic part 54.

SUMMARY OF THE INVENTION

In the method for coating conductive paste shown in FIG. 6, by moving the piston 56 upward to extrude a part of the conductive paste 55 through the opening portion of the slit 53, the paste is made to adhere to the electronic part 54. There are cases in which, because too much of the conductive paste 55 is pushed up by the piston 56, the conductive paste 55 spreads beyond a desired area on the external surface of an electronic part 54. That is, this method makes it difficult to adjust the quantity of conductive paste 55 to be coated on the external surface of the electronic part 54.

Further, in the method shown in FIG. 7, as the conductive paste 55 usually contains solvent, the action of the solvent causes the rubber plate 58 to swell, and accordingly, there are problems in this method, such as variations in the quantity of the conductive paste 55 to be coated on the external surface of the electronic part 54 and the location of the coating.

An object of the present invention is to present a method for forming an electrode on an electronic component part which is able to securely and easily coat conductive paste only in a desired area of an external surface of an electronic part.

Another object of the present invention is to present a conductive paste coating device which makes it possible to securely and easily coat conductive paste on an external surface of an electronic part only in a desired area.

According to a first aspect of the present invention, a method of forming an electrode on electronic component part is provided. The method comprising includes the steps of filling conductive paste in a slit of a slit plate, a width of the slit being nearly equal to the width of an electrode to be formed at an opening in a first surface of the slit plate, and making an external surface of an electronic part come in contact with and press against the first surface of the slit plate, wherein a rubber plate is on a second surface of the slit plate. The method also include elastically deforming the rubber plate to protrude into the slit to make the conductive paste protrude out the first surface of the slit and adhere to the external surface of the electronic part.

According to a second aspect of the present invention, in a method of forming an electrode of electronic component part, the slit in the slit plate has one part which abuts the rubber plate and has a width larger than the opening in the upper surface of the slit plate.

A conductive paste coating device according to a third aspect of the present invention comprises a slit plate having a slit, one opening in a first surface of the slit plate and which passes through to another opening in a second surface of the slit plate, the slit being dimensioned to have conductive paste fill said slit of the slit plate. The device also includes a rubber plate arranged on a second surface of the slit plate, the rubber plate having an elasticity such that, when an electronic part is made to contact and press against the first surface of the slit plate, the rubber plate is elastically deformed to protrude into the slit.

According to a fourth aspect of the present invention, in a conductive paste coating device, one opening in the first surface of the slit plate has a width wider than the other opening in the second surface of the slit plate.

BRIEF DESCRIPTION OF THE DRAWINGS

The present invention will now be described with reference to specific embodiments, to which it is not limited, shown in the accompanying drawings in which.

DESCRIPTION OF PREFERRED EMBODIMENTS

Hereinafter, the present invention is explained by giving nonrestrictive exemplary embodiments of the present invention.

Figure 1:
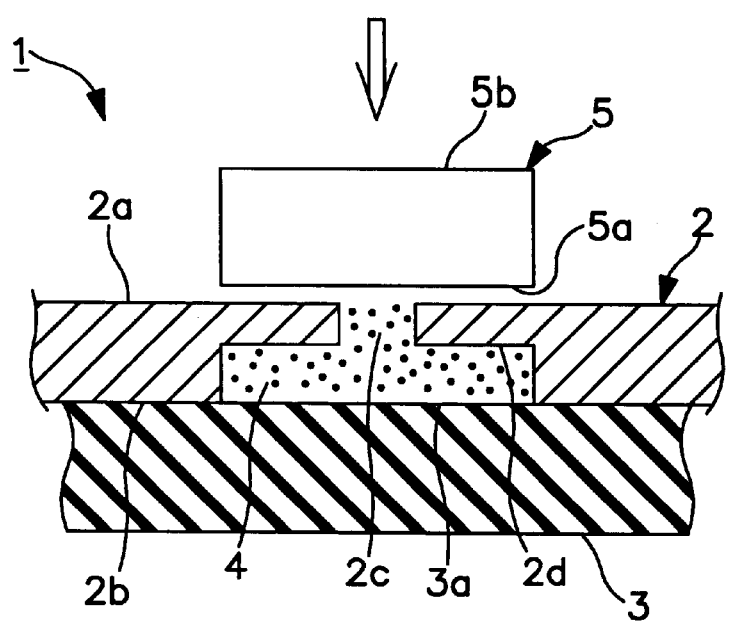
FIG. 1 is a partially cutaway cross sectional view to explain the essential part of a conductive paste coating device according to an embodiment of the present invention.

FIG. 1 is a cross sectional view to explain a conductive paste coating device according to a first embodiment of the present invention. The conductive paste coating device 1 has a slit plate 2 and a rubber plate 3.

The slit plate 2 is composed of a rigid material such as a metal and a synthetic resin which is hard to swell by presence of solvent in the conductive paste. In the slit plate 2, a slit 2c having an opening in the upper surface 2a and passing through the lower surface 2b of the slit plate 2 is formed. In this embodiment, a step portion 2d is formed in order to widen the width of the slit 2c at an intermediate height of the slit 2c. That is, the width of the slit 2c at a position lower than the step portion 2d formed is made wider than the width of the opening in the upper surface of the slit 2c, as shown in FIG. 1.

Conductive paste 4 is filled in the slit 2c. The conductive paste 4 may be composed of an appropriate conductive paste currently being used to form external electrodes of electronic component parts, for example, a paste containing metal powder such as Ag, Ag—Pd, Cu, Ni, etc., frit, and organic binder resin.

The rubber plate 3 is arranged so as to be in contact with the lower surface 2b of the slit plate 2. As a rubber plate 3, a rubber having a low hardness of less than 20 degrees is preferably used, although the invention is not so limited. As specific examples, synthetic rubber such as urethane rubber and silicone rubber or natural rubber can be used as a material constituting the rubber plate 3 although the invention should not be restricted to these examples. Among materials for the rubber plate 3 the above-mentioned materials which are able to realize a low hardness are preferably used.

Next, a method for coating conductive paste 4 on the external surface of an electronic part 5 with the aid of the above-mentioned conductive paste coating device 1 is explained. The electronic part 5 has an upper surface 5a and a lower surface 5b, with reference to the orientation shown in FIG. 1.

When the conductive paste 4 is coated, the conductive paste 4 fills the slit 2c in the conductive paste coating device 1. The electronic part 5 is lowered from above the slit plate 2, as illustrated in FIG. 1. In this case, the electronic part 5 which is held by an appropriate holder, chuck, or other devices, is lowered toward the upper surface 2a of the slit plate 2.

The electronic part 5 is moved to be in contact with and press against the upper surface 2a of the slit plate 2. As the result, the rubber plate 3 is elastically deformed and a part of the upper surface 3a of the rubber plate 3 is protruded into one side of the slit 2c. That is, the rubber plate 3 is deformed so that a part of the rubber plate 3 partially comes into the slit 2c from the side of the upper surface 3a.

In proportion to the above deformation of the rubber plate 3, that is, the quantity which enters the slit 2c, part of the conductive paste 4 is pushed upward and protruded above the upper surface 2a from the slit 2c. Accordingly, the paste adheres to lower external surface 5a of the electronic part 5 which is in contact with and pressed against the upper surface 2a in FIG. 1. In this case, as the lower surface 5a of the electronic part 5 is made in contact with the upper surface 2a of the slit plate 2, the conductive paste 4 adheres to the portion corresponding to the width of the opening in the upper surface 2a of the slit 2c, of the lower surface 5a of the electronic part 5.

Therefore, even if the conductive paste 4 contains organic solvent, the conductive paste 4 is able to be made to adhere to the portion corresponding to the width of the opening in the upper surface 2a of the slit 2c, on an external surface of the electronic part 5 in a highly precise manner, because the slit plate 2 is composed of a material which is hard to swell in solvent, although the present invention allows for the possibility that the rubber plate 3 swells during its use.

Further, the quantity of coating of the conductive paste 4 is able to be easily adjusted by adjustment of the total content of the slit 2c. In particular, the content of the slit 2c is able to be easily adjusted only by adjustment of the dimensions of the slit 2c.

Therefore, in the conductive paste coating device of the present embodiment, the conductive paste 4 is able to be made to adhere to a desired area of an external surface of the electronic part 5 in a highly precise manner and in an easy way, and the quantity of coating of the conductive paste is able to be controlled in an easy and secure way.

Additionally, after the conductive paste has been made to adhere to the lower surface of the electronic part, the electronic part 5 is able to be moved away from the slit plate 2a and supplied to subsequent processes wherein the electronic part 5 is held by a holder, a chuck, etc.

Further, in the conductive paste coating device 1, after the coating of the conductive paste 4 on the electronic part 5 has been finished, new conductive paste is supplied into the slit 2c before a next electronic part 5 is supplied. In this case, the quantity of conductive paste to be supplied is set to be equal to the quantity of consumption in the previous coating. Also, the conductive paste is easily supplied by putting the conductive paste on the slit plate 2 and, for example, by moving a squeegee on the upper surface 2a of the slit plate 2.

Figure 2:
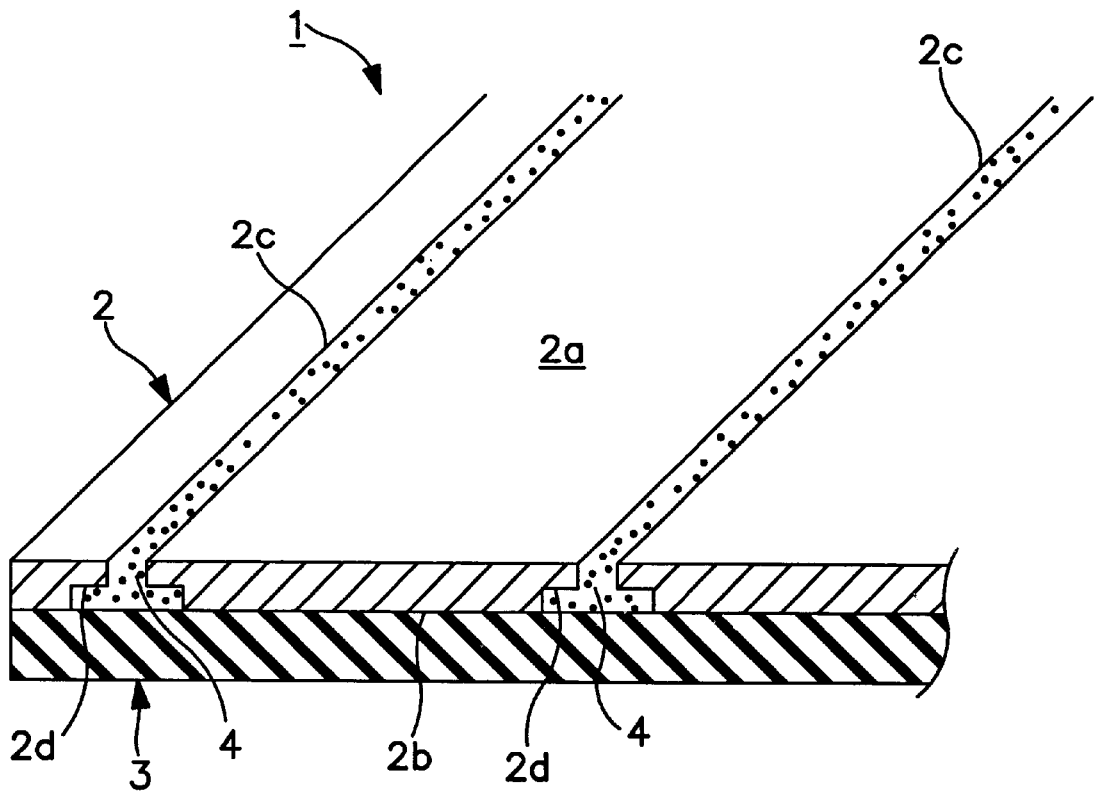
FIG. 2 is a partially sectional perspective view to explain an external view of the conductive paste coating device shown in FIG. 1.

Furthermore, in FIG. 1, the cross sectional view of the principle part in the conductive paste coating device 1 of the present embodiment is shown. However, practically the above slit 2c is extended in the direction perpendicular to the width of the slit 2c in the conductive paste coating device 1 as shown in FIG. 2. Also, regarding the above slit 2c, a plurality of slits 2c are given in proximity in a row arrangement in the slit plate 2. Accordingly, in the conductive paste coating device 1 shown in FIG. 2, the conductive paste 4 is able to be coated on a plurality of electronic parts 5 at a time, though in the conductive paste coating device according to the present invention as few a one slit 2c may be provided in the slit plate 2.

Figure 3:
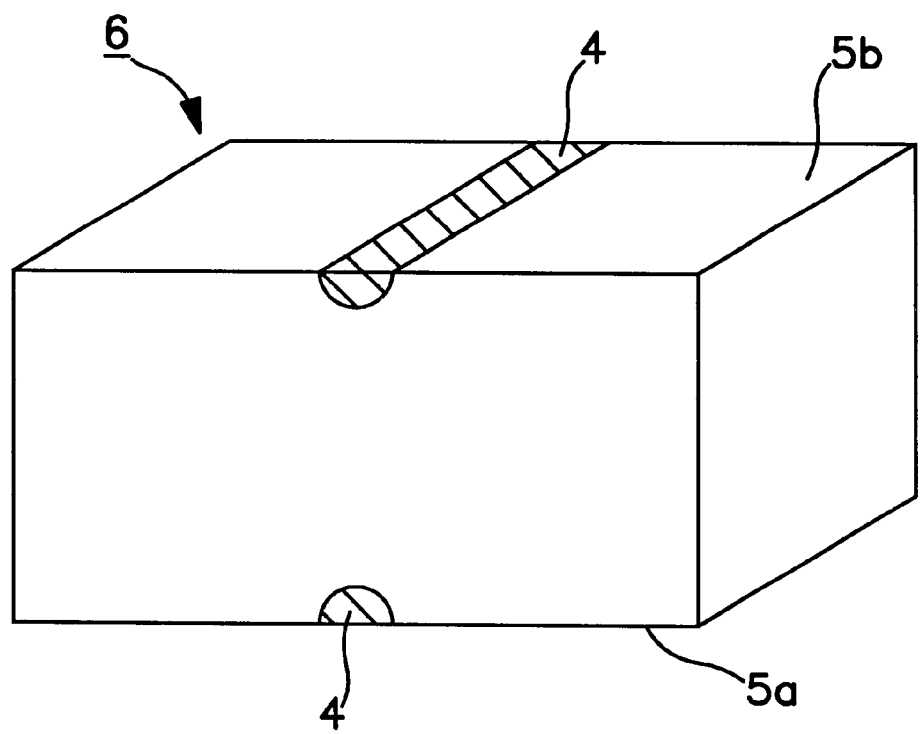
FIG. 3 is a perspective view showing an electronic component part with conductive paste coated with the aid of a conductive paste coating device of the embodiment shown in FIG. 1.

Further, with the aid of the conductive paste coating device 1 shown in FIG. 1, when conductive paste is coated on an external surface of the electronic part 5 and an electrode is formed, there are many cases in which conductive paste 4 is coated and an electrode is formed not only on the lower surface 5a of the electronic part 5 shown in FIG. 1, but also on the upper surface 5b in the same manner. In those cases, after the coating of the above conductive paste 4 on the electronic part 5 has been finished, the upper and lower sides of the electronic part 5 may be reversed and the conductive paste 4 be again coated on an external surface of the electronic part. In this way, an electronic component part 6 shown in FIG. 3 is made available. Regarding the electronic component part 6, conductive paste 4 is coated in the middle of the upper surface 5b and lower surface 5a of the electronic part 5 respectively. The process is completed by baking the coated conductive paste 4 to form an electrode, though when using a conductive paste not containing frit the conductive paste may be solidified by evaporating solvent to be completed as an electrode.

Figure 4:
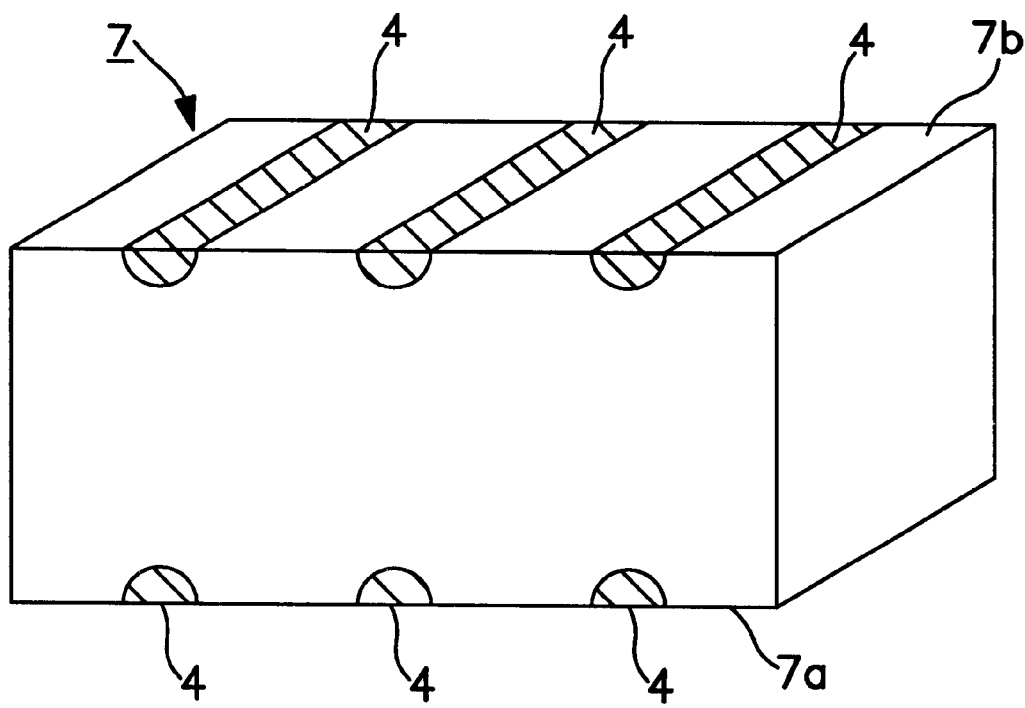
FIG. 4 is a perspective view to explain another example of an electronic part with conductive paste coated according to the present invention.

Further, as in an electronic component part 7 shown in FIG. 4, on either of the upper surface 7b and lower surface 7a, the conductive paste coating device of the present invention can be used for coating conductive paste 4 in a plurality of linear areas. That is, as shown in FIG. 4, when it is required to coat the conductive paste 4, 4, 4 in three areas, the spacings between slits 2c in the conductive paste coating device 1 shown in FIG. 2 may be adjusted in accordance with the three linear areas. That is, by the three slits 2c given in proximity in a row arrangement in proportion with the spacings between the above conductive paste 4, 4, 4, the conductive paste 4, 4, 4 can be coated in the three linear areas in an easy and secure way. Naturally, non-linear areas can be coated in a similar manner.

Further, in the conductive paste coating device of the present embodiment shown in FIG. 1, a step portion 2d has been given at an intermediate height in the slit 2c. But the step portion 2d may not be necessarily. That is, the slit 2c may be constructed so as to pass through into the side of the lower surface 2b, having the width equal to the opening in the upper surface 2a of the slit plate 2 as shown in FIG. 5.

Figure 5:
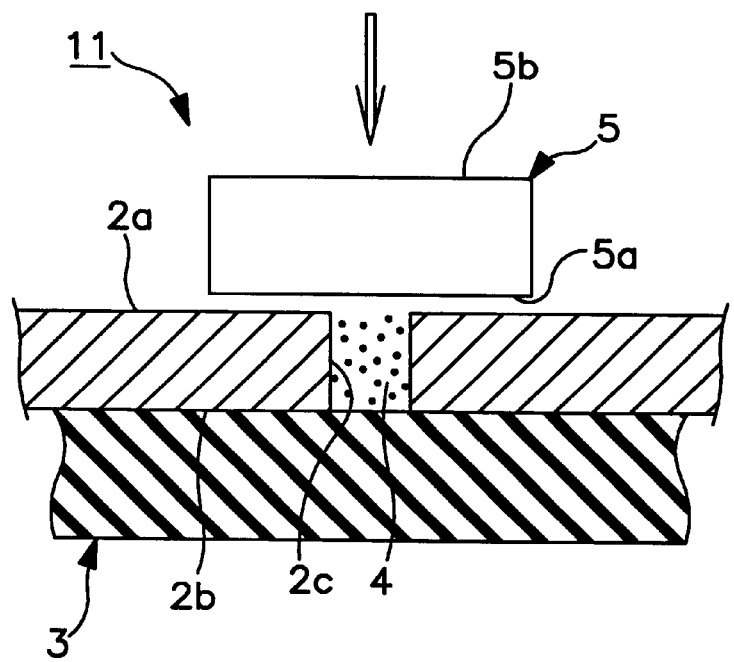
FIG. 5 is a partially cutaway cross sectional view to explain another example of a conductive paste coating device according to the present invention.
Figure 6:
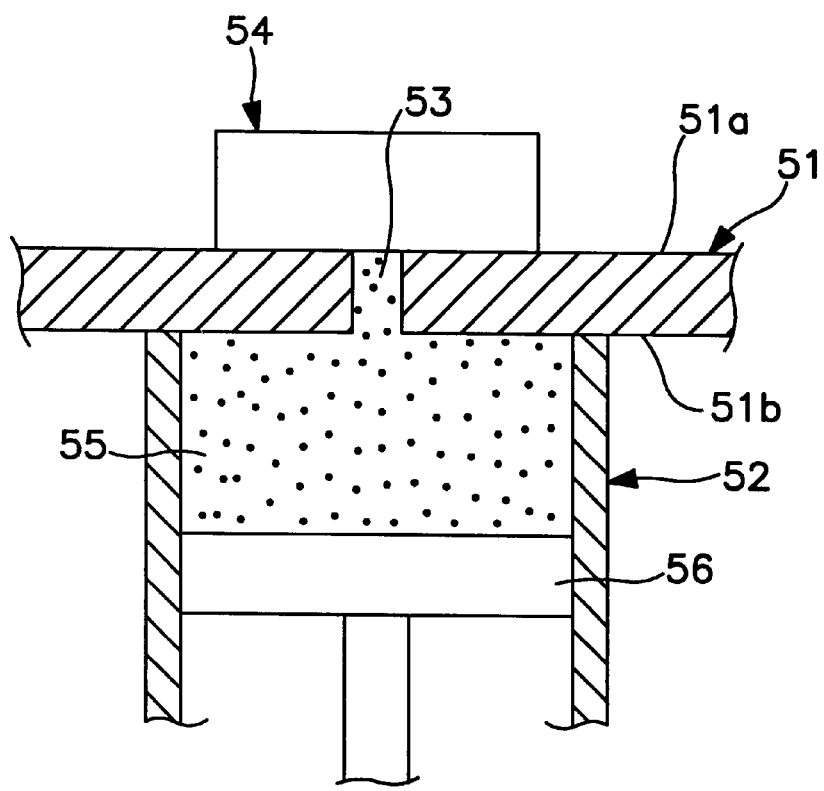
FIG. 6 is a cross sectional view to explain an example of a conventional conductive paste coating method.
Figure 7:
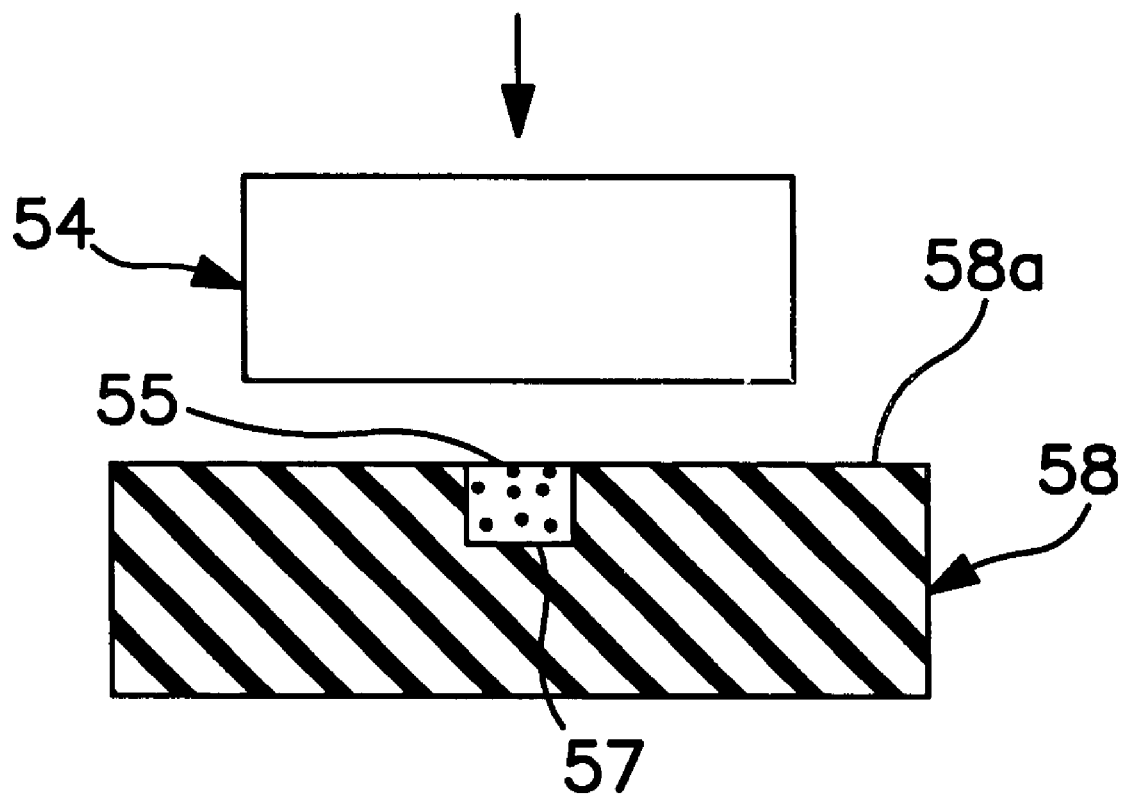
FIG. 7 is a cross sectional view to explain another example of a conventional conductive paste coating method.

Also, in the conductive paste coating device 11 shown in FIG. 5, when an electronic part 5 is made in contact with and pressing against the upper surface 2a of the slit plate 2, the rubber plate 3 is elastically deformed and the upper surface 3a thereof protrudes into the slit 2c. Accordingly, in the same way as the embodiment shown in FIG. 1, a conductive paste 4 filled in the slit 2c is made to securely adhere to the width equal to the slit 2c, of the lower surface 5a of the electronic part 5.

Indeed, as in the embodiment shown in FIG. 1, by giving a step portion 2d and widening the width of the lower part of slit 2c, the rubber plate 3 is made to be easily deformed and protrude into the slit 2c. Also, the conductive paste on the side of the opening in the upper surface 2a of the slit 2c is highly vulnerable to changes in its viscosity because the conductive paste is exposed to the open air. On the other hand, the conductive paste filled in the lower part than the step portion 2d of the slit 2c is not exposed to the air very much and accordingly its viscosity changes very little. Therefore, because of the elastic deformation of the rubber plate 3 a certain amount of conductive paste 4 is protruded through the upper surface 2a of the slit 2c in a more secure way. Accordingly, as in the embodiment shown in FIG. 1, it is desirable to make the width of the lower part of the slit 2c wider than the opening in the upper surface 2a.

Further, the present invention is not limited to the illustrated types of electronic component parts. The present invention is able to be applied to not only electronic parts in the form of a rectangular solid, but also electronic parts in the appropriate form of a rectangular plate, a circular plate, etc., and in a more concrete way to various electronic component parts such as capacitors, thermistors, electronic circuit boards of a single layer or laminated type the present invention can be applied.

Furthermore, the present invention is appropriate to cases using conductive paste containing organic solvent.

However, in cases using water soluble conductive paste the method for forming an electrode and conductive paste coating device according to the present invention can be used.

According to a first aspect of the present invention, in a method for forming an electrode of an electronic component part, when conductive paste is filled in a slit of a slit plate formed so as to have an opening in the upper surface of the slit plate and a rubber plate is arranged on the side of the lower surface of the slit plate, the slit width being nearly equal to the width of an electrode to be formed, makes the conductive paste adhere to the external surface of an electronic component part by making an electronic part come into contact with and pressing against the upper surface of the slit plate and by making the rubber plate elastically deform. In this case, the rubber plate protrudes into the slit because of its elastic deformation, and accordingly the conductive paste in the slit is protruded over the slit. As the result, the conductive paste adhered an external surface of the electronic part having a width nearly equal to the slit in a secure and easy way.

Further, because the conductive paste is made to adhere to an external surface of an electronic part as described above, the quantity of conductive paste to be coated can be easily adjusted only by adjustment of the dimensions of the slit. In addition, the content of the slit is able to be easily adjusted by changing the thickness of the slit plate or other dimensions, and therefore the quantity of conductive paste to be coated is able to be controlled in an easy and highly precise manner.

More, even if conductive paste contains solvent and the rubber plate swells, regardless of the swelling of the rubber plate the conductive paste is able to be coated on the external surface of an electronic part in proportion with the content and width of the slit in a highly precise manner.

Accordingly, it becomes possible to coat conductive paste on a desired area of the external surface of an electronic part in a secure and highly precise manner without variation.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A method of forming an electrode on electronic component part, said method comprising:

filling conductive paste in a slit of a slit plate, a width of said slit being nearly equal to the width of an electrode to be formed at an opening in a first surface of the slit plate;

making an external surface of an electronic part come in contact with and press against said first surface of the slit plate, wherein an elastomer is on a second surface of the slit plate;

elastically deforming said elastomer to protrude into said slit to make the conductive paste protrude out of said slit and adhere to the external surface of the electronic part; and wherein said first surface opposes said second surface and said step of elastically deforming includes pressing said electronic part towards said elastomer.

2. The method of forming an electrode on an electronic component part according to claim 1, wherein a part of the slit abutting said elastomer has a width wider than the opening in surface of the slit plate.

3. A method of forming an electrode on an electronic component part, said method comprising:

filling conductive paste in a slit plate, a width of said slit being nearly equal to a width of an electrode to be formed at an opening in a first surface of the slit plate;

making an external surface of an electronic part come in contact with and press against said first surface of the slit plate, wherein an elastomer is on a second surface of the slit plate;

elastically deforming said elastomer to protrude into said slit to make the conductive paste protrude out of said slit and adhere to the external surface of the electronic part; and wherein said slit includes two ledge portions which extend from their respective outer walls towards a center area of the slit to form said opening.

4. A method of forming an electrode on an electronic component part, said method comprising:

filling conductive paste in a slit of a slit plate, a width of said slit being nearly equal to a width of an electrode to be formed at an opening in a first surface of the slit plate;

making an external surface of an electronic part come in contact with and press against said first surface of the slit plate, wherein an elastomer is on a second surface of the slit plate;

elastically deforming said elastomer to protrude into said slit to make the conductive paste protrude out of said slit and adhere to the external surface of the electronic part; and wherein a part of the slit abutting said elastomer has a width wider than said opening in the surface of the slit plate, said slit includes two ledge portions which extend from their respective outer walls towards a center area of the slit to form said opening.

* * * * *